United States Patent [19]
Isshiki et al.

[11] Patent Number: 5,872,194
[45] Date of Patent: Feb. 16, 1999

[54] CURABLE LIQUID-FORM COMPOSITION, CURED PRODUCT OF THE SAME, AND ELECTRONIC PART

[75] Inventors: Minoru Isshiki; Katsutoshi Mine; Kimio Yamakawa, all of Chiba, Japan

[73] Assignee: Dow Corning Toray Silicone Co., Ltd., Tokyo, Japan

[21] Appl. No.: 889,377

[22] Filed: Jul. 8, 1997

[30] Foreign Application Priority Data

Jul. 8, 1996 [JP] Japan ..................................... 8-197048

[51] Int. Cl.$^6$ .................................................. C08F 283/12
[52] U.S. Cl. ............................. 525/476; 528/27; 428/447
[58] Field of Search ............................... 528/27; 525/476; 428/447

[56] References Cited

U.S. PATENT DOCUMENTS

| | | | |
|---|---|---|---|
| 4,623,694 | 11/1986 | Keil | 524/731 |
| 4,624,998 | 11/1986 | Keil | 525/476 |
| 4,663,397 | 5/1987 | Morita et al. | 525/398 |
| 4,707,529 | 11/1987 | Hoffman et al. | 525/476 |
| 4,808,640 | 2/1989 | Morita et al. | 523/433 |
| 5,082,891 | 1/1992 | Morita et al. | 524/481 |
| 5,530,075 | 6/1996 | Morita et al. | 525/431 |
| 5,561,174 | 10/1996 | Saito et al. | 523/403 |

FOREIGN PATENT DOCUMENTS

| | | |
|---|---|---|
| 54-54168 | 4/1979 | Japan . |
| 55-3412 | 1/1980 | Japan . |
| 1-38418 | 2/1989 | Japan . |
| 2-41353 | 2/1990 | Japan . |
| 5-295233 | 11/1993 | Japan . |

*Primary Examiner*—Margaret W. Glass
*Attorney, Agent, or Firm*—Larry A. Milco

[57] ABSTRACT

A curable composition containing a curable liquid-form organopolysiloxane composition and a curable liquid-form organic resin composition. The organic resin composition is contained as liquid particles in the organopolysiloxane composition. A cured product formed by curing the abovementioned curable liquid composition such that the cured product contains fine particles of a cured organic resin in a cured organopolysiloxane matrix. An electronic part which is covered by the cured product of the abovementioned curable liquid-form composition.

9 Claims, 2 Drawing Sheets

CURABLE LIQUID-FORM COMPOSITION, CURED PRODUCT OF THE SAME, AND ELECTRONIC PART

BACKGROUND OF THE INVENTION

1. Field of the Invention

The present invention concerns a curable liquid-form composition, the cured product of said composition, and an electronic part. More specifically, the present invention concerns (a) a curable liquid-form composition which has superior working characteristics in liquid form prior to being cured, and which when cured forms a cured product which has superior pliability, initial bonding characteristics and bonding durability in spite of the fact that the hardness of said cured product is relatively high; (b) a cured product which has superior pliability in spite of the fact that the hardness of said cured product is relatively high; and (c) an electronic part with superior reliability which is covered by the cured product of the abovementioned composition.

2. Description of the Related Art

Curable liquid-form organopolysiloxane compositions have superior working characteristics in the liquid state prior to being cured; furthermore, when cured, such compositions form cured products which have superior electrical characteristics such as volume resistivity, insulation breakdown strength and dielectric constant, etc. Accordingly, such compositions can be favorably used as covering agents such as protective agents and sealing agents, etc., for electronic parts. However, although the cured products of such compositions have a relatively high hardness and high pliability, these cured products have a low mechanical strength. Accordingly, electronic parts which are covered by such cured products are easily damaged by external stress. Generally, the cured products obtained from such compositions can be endowed with mechanical strength and a high hardness by mixing large quantities of inorganic fillers or organic filers with the compositions. However, the compositions obtained as a result have poor fluidity in the liquid state, and show a conspicuous drop in working characteristics. Furthermore, such compositions also show a drop in bonding characteristics with respect to various types of materials. Moreover, electronic parts which are covered by the cured products of such compositions do not show a very great improvement in reliability (in terms of resistance to moisture, etc.).

Curable liquid-form organic resin compositions, such as, for example, curable liquid-form epoxy resin compositions, curable liquid-form polyimide resin compositions and curable liquid-form phenol resin compositions, also have superior working characteristics in the liquid state prior to being cured, and can therefore penetrate into minute areas of electronic parts. The cured products of such compositions have good electrical properties and can, therefore, used as covering agents for electronic parts. However, such cured products have a high hardness, poor pliability and a large mechanical strength. As a result electronic parts which are covered by such cured products are easily damaged by internal stresses, and crag tends to occur in the cured products themselves. Accordingly, numerous methods have been proposed to reduce the hardness and increase the pliability of cured products obtained from such compositions without causing a drop in the mechanical strength of such cured products. One such method involves mixing large quantities of fine particles of a cured organopolysiloxane with the compositions (see Japanese Patent Application Kokai No. 61-225253, Japanese Patent Application Kokai No. 62-232460, Japanese Patent Application Kokai No. 1-221457 and Japanese Patent Application Kokai No. 2-41353). However, such compositions show poor fluidity and a conspicuous deterioration in working characteristics. Furthermore, such compositions exhibit decreased adhesion to various types of materials. Moreover, electronic parts which are covered by the cured products of such compositions do not show a very great improvement in reliability (in terms of resistance to moisture, etc.).

In order to solve such problems, curable liquid-form compositions which consist of a curable liquid-form organopolysiloxane composition and a curable liquid-form organic resin composition, and in which the organopolysiloxane composition is contained as liquid particles in the organic resin composition, have been proposed (see Japanese Patent Application Kokai 54-54168, Japanese Patent Application Kokai No. 55-3412, Japanese Patent Application Kokai No. 64-38418 and Japanese Patent Application Kokai No. 5-295233). However, although such curable liquid-form compositions have superior working characteristics in the liquid state prior to being cured, the curing of these compositions produces cured products in which fine particles of a cured organopolysiloxane are contained in a matrix consisting of a cured organic resin. As a result these cured products still have a high hardness, poor pliability and a high mechanical strength. Accordingly, in the case of electronic parts covered by means of such cured products, the problems of susceptibility to damage caused by internal stresses and susceptibility of the cured products themselves to cracking have not been sufficiently solved Furthermore, although these cured products show good initial bonding characteristics with respect to various types of materials, the bonding durability of such cured products is unsatisfactory. In addition, electronic parts which are covered by the cured products of such compositions do not show satisfactory reliability.

It is an object of the present invention is to provide (a) a curable liquid-form composition which has superior working characteristics in liquid form prior to being cured, and which when cured forms a cured product which has superior pliability, initial bonding characteristics and bonding durability in spite of the fact that the hardness of said cured product is relatively high, (b) a cured product which has superior pliability in spite of the fist tat the hardness of said cured product is relatively high, and (c) an electronic part with superior reliability which is covered by the cured product of the abovementioned composition.

SUMMARY OF THE INVENTION

The curable liquid-form composition of the present invention is characterized by the fact that said composition consists of a curable liquid-form organopolysiloxane composition and a curable liquid-form organic resin composition, with said organic resin composition being contained as liquid particles in the aforementioned organopolysiloxane composition.

Furthermore, the cured product of the present invention is characterized by the fact that said product is formed by curing the abovementioned curable liquid-form composition, and said product contains a cured organic resin as fine particles in a matrix consisting of a cured organopolysiloxane.

Furthermore, the electronic part of the present invention is characterized by the fact that said part is covered by the cured product of the abovementioned curable liquid-form composition.

DETAILED DESCRIPTION OF THE INVENTION

Figure 1:
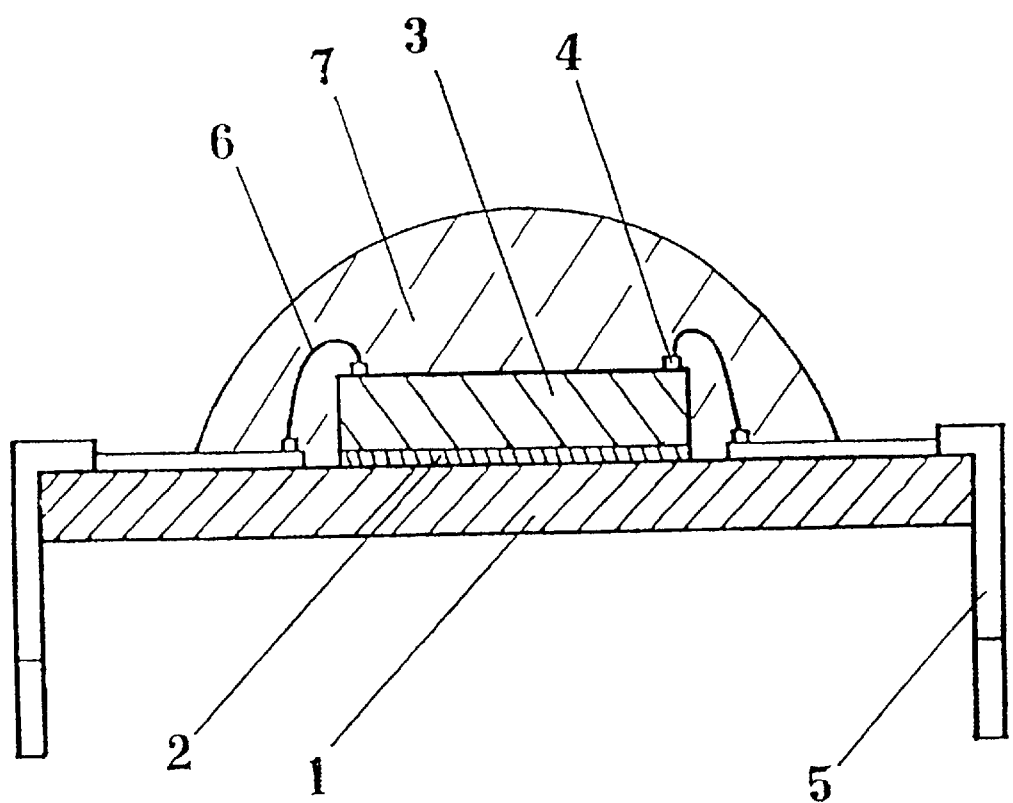
FIG. 1 is a sectional view of the electronic part of the present invention.

First, the curable liquid-form composition of the present invention will be described in detail.

The curable liquid-form composition of the present invention is characterized by the fact that said composition consists of a curable liquid-form organopolysiloxane composition and a curable liquid-form organic resin composition, with said organic resin composition being contained as liquid particles in the aforementioned organopolysiloxane composition. In the composition of the present invention, the abovementioned curable liquid-form organopolysiloxane composition is a component which is used to form the matrix of the cured product when said component is cured. It is desirable that this component itself be a component which has a rubber-like consistency when cured. In particular, a component whose cured product has a rubber-like consistency with a JIS A hardness of 10 to 90 (as determined by means of a JIS A hardness tester as stipulated in JIS K 6301) is desirable. Furthermore, the abovementioned curable liquid-form organic resin composition is a component which forms dispersed fine particles in the matrix of the abovementioned cured product when said component is cured, and which is used to endow the cured product with hardness without lowering the pliability or bonding characteristics of the cured product. It is desirable that this component itself form a cured product in which the aforementioned JIS A hardness exceeds 90 when said component is cured. Thus, the composition of the present invention is completely different from curable liquid-form organopolysiloxane compositions, curable liquid-form organic resin compositions and curable liquid-form compositions in which a curable liquid-form organopolysiloxane composition is contained as liquid particles in a curable liquid-form organic resin composition, etc., in that the composition of the present invention can form a cured product which has a higher hardness and better bonding characteristics than a cured product obtained by curing a curable liquid-form organopolysiloxane composition itself, and which has better pliability and better bonding durability than a curable liquid-form organic resin composition itself or a cured product obtained by curing such a curable liquid-form composition. Furthermore, the special features of the composition of the present invention are especially evident from the fact that superior reliability is obtained in cases where electronic parts are covered by the cured product of his composition. In the composition of the present invention, there are no restrictions on the content of the aforementioned curable organic resin composition. However, it is desirable that said content be 0.01 to 80 wt %, and a content of 10 to 70 wt % is especially desirable. The reasons for this are as follows: i.e., if the content of the curable organic resin composition is less than the lower limit of the abovementioned range, it tends to become difficult to obtain a high hardness in the cured product that is obtained. On the other hand, if this content exceeds the upper limit of the abovementioned range, only a curable liquid-form composition in which the abovementioned curable organopolysiloxane component is contained as liquid particles in this curable organic resin component can be obtained, and since the cued product of such a composition has a high hardness, poor pliability and high mechanical strength, electronic parts covered by this cured product are susceptible to damage caused by internal stresses, and the cured product itself is susceptible to cracking; furthermore, the bonding durability tends to drop.

In the composition of the present invention, the aforementioned curable liquid-form organic resin composition is contained as liquid particles in the aforementioned curable liquid-form organopolysiloxane composition. There are no particular restrictions on the mean particle size of these liquid particles; however, it is desirable that said mean particle size be 1 mm or less, and a mean particle size of 0.1 mm or less is especially desirable. The reason for this is that if the mean particle size of these liquid particles exceeds the abovementioned upper limit, the mechanical characteristics of the cured product that is obtained tend to deteriorate.

There are no restrictions on the curing mechanism used to cure the abovementioned curable liquid-form organopolysiloxane composition. Examples of curing methods which can be used include thermal curing (by means of a hydrosilylation reaction or a radical reaction with organic peroxides), moisture curing and ultraviolet curing. From the standpoint of achieving a rapid curing rate, thermal curing by means of hydrosilylation reaction or radical reaction with organic peroxides is desirable; furthermore, thermal curing by means of a hydrosilylation reaction is especially desirable in that such curing does not produce by-products during curing, and is particularly suitable for use in the case of covering agents used on electronic parts. Furthermore, the curing mechanism used to cure the abovementioned curable liquid-form organic resin composition is also unrestricted. Examples of curing methods which can be used include thermal curing, moisture curing and ultraviolet curing. In this case as well, thermal curing is desirable from the standpoint of achieving a rapid curing rate. In order to obtain a rapid curing rate in the composition of the present invention, it is desirable that the curable liquid-form organopolysiloxane composition be a heat-curable composition, and that the curable liquid-form organic resin composition also be a heat-curable composition. In particular, from the standpoint of obtaining a cured product which has good initial bonding characteristics and good bonding durability, and which is especially suitable for use as a covering agent for electronic parts, it is desirable that the curable liquid-form organopolysiloxane composition be a composition which is heat-curable by means of a hydrosilylation reaction, and that the curable liquid-form organic resin composition also be a heat-curable composition.

A preferred embodiment of such a heat-curable liquid-form organopolysiloxane composition which can be cured by means of a hydrosilylation reaction is a composition comprising (A) an organopolysiloxane which has at least two alkenyl groups bonded to silicon atoms in each molecule, (B) an organopolysiloxane which has at least two hydrogen atoms bonded to silicon atoms in each molecule (used in an amount which is such that the molar ratio of hydrogen atoms bonded to silicon atoms in component (B) to alkenyl groups bonded to silicon atoms in component (A) is from 0.1 to 30), and C) a hydrosilylation reaction catalyst (used in an amount which is sufficient to cure this organopolysiloxane composition).

The organopolysiloxane of component (A) is the main component of the abovementioned organopolysiloxane composition, and is characterized by the fact that said organopolysiloxane has at least two alkenyl groups bonded to silicon atoms in each molecule. Examples of such alkenyl groups include vinyl groups, allyl groups, butenyl groups, pentenyl groups and hexenyl groups. Furthermore, examples of groups other than alkenyl groups which can be bonded to the abovementioned silicon atoms include substituted or unsubstituted monovalent hydrocarbon groups, e.g., alkyl groups such as methyl groups, ethyl groups, propyl groups and butyl groups, etc., aryl groups such as phenyl groups, tolyl groups and xylyl groups, etc., aralkyl groups such as benzyl groups and phenethyl groups, etc., and halogenated alkyl groups such as 3,3,3-trifluoropropyl groups, etc. Furthermore, the molecular structure of this organopolysiloxane may be linear, linear with some branching, branched, cyclic or resin-form. Moreover, it is desirable that the viscosity of this organopolysiloxane at 25° C. be 10 to 1,000,000 centipoise (mPa.s.). Examples of such organopolysiloxanes which may be used as component (A) include dimethylvinylsiloxy-terminated dimethylpolysiloxanes, dimethylvinylsiloxy-terminated-dimethylsiloxane-methylvinylsiloxane copolymers, trimethylsiloxy-terminated-methylvinylpolysiloxanes, trimethylsiloxy-terminated dimethylsiloxane-methylvinylsiloxane copolymers, organopolysiloxanes consisting of $(CH_2=CH)(CH_3)_2SiO_{1/2}$ units and $SiO_{4/2}$ units, organopolysiloxanes consisting of $(CH_3)_3SiO_{1/2}$ units, $(CH_2=CH)(CH_3)_2SiO_{1/2}$ units and $SiO_{4/2}$ units, organopolysiloxanes consisting of $(CH_3)_3SiO_{1/2}$ units, $(CH_2=CH)(CH_3)_2SiO_{1/2}$ units, $(CH_3)_2SiO_{2/2}$ units and $SiO_{4/2}$ units, organopolysiloxanes in which some of the methyl groups in the abovementioned organopolysiloxanes are replaced by all groups (other than methyl groups), phenyl groups or 3,3,3-trifluoropropyl groups, and mixtures of two or more of the abovementioned organopolysiloxanes.

The organopolysiloxane of component (B) is a curing agent for the abovementioned organopolysiloxane composition, and is characterized by the fact that said organopolysiloxane has at least two hydrogen atoms bonded to silicon atoms in each molecule. Examples of groups other than hydrogen atoms which can be bonded to the abovementioned silicon atoms include substituted or unsubstituted monovalent hydrocarbon groups, e.g., alkyl groups such as methyl groups, ethyl groups, propyl groups and butyl groups, etc., aryl groups such as phenyl groups, tolyl groups and xylyl groups, etc., aralkyl groups such as benzyl groups and phenethyl groups, etc., and halogenated alkyl groups such as 3,3,3-trifluoropropyl groups, etc. Furthermore, the molecular structure of this organopolysiloxane may be linear, linear with some branching, branched, cyclic or resin-form. Moreover, it is desirable that the viscosity of this organopolysiloxane at 25° C. be 1 to 10,000 centipoise (mPa.s.).

It is desirable that the amount of component (B) that is used be such that the molar ratio of the hydrogen atoms bonded to silicon atoms in component (B) to the alkenyl groups bonded to silicon atoms in component (A) is from 0.1 to 30, and an amount which is such that this molar ratio from 0.5 to 10 is especially desirable. The reasons for this are as follows: if the molar ratio of the hydrogen atoms bonded to silicon atoms in component (B) to the alkenyl groups bonded to silicon atoms in component (A) is smaller 0.1, the organopolysiloxane composition tends to be insufficiently cured. If this molar ratio exceeds 30, the mechanical strength of the cured product obtained by curing the organopolysiloxane composition tends to drop.

The hydrosilylation reaction catalyst of component (C) is a component which is used to promote the curing of the abovementioned organopolysiloxane composition by a hydrosilylation reaction. Examples of catalysts which can be used include platinum type catalysts such as platinum black, fine particulate platinum, platinum supported on active carbon, platinum supported on powdered silica, chloroplatinic acid, alcohol solutions of chloroplatinic acid, olefin complexes of platinum and alkenylsiloxane complexes of platinum, etc., rhodium type catalysts, palladium type catalysts and powdered heat-curable organic resins containing such catalysts.

The amount of component (C) that is added is an amount which is sufficient to cure the abovementioned organopolysiloxane composition. For example, in cases where a platinum type catalyst is used as this component, it is desirable that the amount of catalyst used be such that the amount of platinum metal in the component be from 0.1 to 1,000 ppm (in weight units) relative to the organopolysiloxane composition. An amount from 0.5 to 500 ppm is especially desirable. If the amount of this component is less than 0.1 ppm, the organopolysiloxane composition tends not to be cured quickly. If the amount used exceeds 1,000 ppm there is no acceleration of the curing rate of the organopolysiloxane composition attributable to such excess, and coloring tends to occur in the cured product that is obtained.

As other optional components, the abovementioned organopolysiloxane composition may also contain (for example) addition reaction inhibiting agents which are used to adjust the rate of curing by means of the aforementioned hydrosilylation reaction, e.g., acetylene type compounds such as 3-methyl-1-butyn-3-ol, 3,5-dimethyl-1-hexyn-3-ol and 3-phenyl-1-butyn-3-ol, etc., enyne compounds such as 3-methyl-3-penten-1-yne and 3,5-dimethyl-3-hexen-1-yne, etc., siloxane compounds containing alkenyl groups such as 1,3,5,7-tetramethyl-1,3,5,7-tetravinylcyclotetrasiloxane and 1,3,5,7-tetramethyl-1,3,5,7-tetrahexenylcyclotetrasiloxane, etc., and other compounds such as benzotriazole, etc. It is desirable that the amount of such addition reaction inhibiting agents added be from 10 to 5,000 ppm (in weight units) relative to the organopolysiloxane composition.

Next, heat-curable liquid-form organic resin compositions are desirable for use as the curable liquid-form organic resin composition which is contained as liquid particles in the abovementioned curable liquid-form organopolysiloxane composition. Examples of such heat-curable liquid-form organic resin compositions include heat-curable liquid-form epoxy resin compositions, heat-curable liquid-form phenol resin compositions, heat-curable liquid-form polyester resin compositions, heat-curable liquid-form fluororesin compositions and heat-curable liquid-form polyimide resin compositions. In particular, heat-curable liquid-form epoxy resins are especially desirable.

A preferred embodiment of such a heat-curable liquid-form epoxy resin composition is a composition comprising (i) 100 parts by weight of a liquid-form epoxy resin which has at least two epoxy groups per molecule, (ii) 0.1 to 200 parts by weight of a silanol-terminated diorganosiloxane oligomer and (iii) a curing catalyst (used in an amount sufficient to cure this epoxy resin composition).

The liquid-form epoxy resin of component (i) is the main component of the abovementioned epoxy resin composition, and is characterized by the fact that said resin has at least two epoxy groups per molecule. The molecular structure of this resin may be linear, linear with some branching, branched, cyclic or resin-form. It is desirable that the viscosity of this resin at 25° C. be from 10 to 1,000,000 centipoise (mPa.s.). Examples of such liquid-form epoxy resins which can be used as component (i) include glycidyl ether type epoxy resins such as bisphenol A type epoxy resins, bisphenol F type epoxy resins, phenol novolak type epoxy resins, ortho-cresol novolak type epoxy resins, brominated epoxy resins and biphenyl type epoxy resins, etc., cyclic aliphatic epoxy resins, glycidyl ester type epoxy resins, glycidylamine type epoxy resins and heterocyclic epoxy resins. Bisphenol type epoxy resins are especially desirable.

The silanol-terminated diorganosiloxane oligomer which constitutes component (ii) is a curing agent for the above-mentioned epoxy resin composition. Examples of siloxane oligomers which can be used as component (ii) include silanol-terminated dimethylsiloxane oligomers, silanol-terminated dimethylsiloxane-methylvinylsiloxane copolymer oligomers, silanol-terminated diphenylsiloxane oligomers, silanol-terminated methylphenylsiloxane oligomers, silanol-terminated methylphenylsiloxane-methylvinylsiloxane copolymer oligomers and mixtures consisting of two or more types of such siloxane oligomers. Furthermore, from the standpoint of component (ii) having a good affinity for component (i), it is desirable that 10 mol % or more of the organic groups bonded to silicon atoms in this component be phenyl groups.

The amount of component (ii) that is added is 0.1 to 200 parts by weight (preferably 1 to 100 parts by weight, and even more preferably 10 to 60 parts by weight) per 100 parts by weight of component (i). If the amount of component (ii) that is added is less than 0.1 parts by weight, the epoxy resin composition tends to show insufficient curing. If the amount added exceeds 200 parts by weight, the mechanical strength of the cured product obtained by curing the epoxy resin tends to drop.

The curing catalyst of component (iii) is a component which is used to promote the curing of the abovementioned epoxy resin composition. Examples of catalysts which can be used include tertiary amine compounds, compounds of metals such as aluminum and zirconium, etc., organophosphorus compounds such as phoshpine, etc., heterocyclic amine compounds, boron complex compounds, organo-aluminum compounds, organo-aluminum chelate compounds, organic ammonium salts, organic sulfonium salts and organic peroxides. In cases where the curable liquid-form organopolysiloxane component is a component which is heat-curable by means of a hydrosilylation reaction, organo-aluminum compounds are especially desirable as component (iii), since such compounds do not interfere with the hydrosilylation reaction. The amount of this component that is added is an amount which is sufficient to cure the epoxy resin composition. In preferred embodiments, component (iii) is present in an amount from 0.01 to 10 parts by weight per 100 parts by weight of component (i).

The composition of the present invention consists of a curable liquid-form organopolysiloxane composition and a curable liquid-form organic resin composition. From the standpoint of achieving a uniform dispersion of the above-mentioned organic resin composition as liquid particles in the abovementioned organopolysiloxane composition, and also from the standpoint of allowing a small mean particle size of said liquid particles and achieving long-term stabilization of such a state, it is desirable that the composition of the present invention contain a polysiloxane which can be expressed by the following average unit formula:

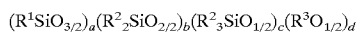

In particular, such a polysiloxane can endow the composition of the present invention with good bonding characteristics, i.e., good initial bonding characteristics and bonding durability, and is therefore desirable. In the above formula, $R^1$ indicates an epoxy-group-containing monovalent organic group; examples of groups which can be used include glycidoxyalkyl groups such as 3-glycidoxypropyl groups and 4-glycidoxybutyl groups, etc., epoxycyclohexylalkyl groups such as 2-(3,4-epoxycyclohexyl)ethyl groups and 3-(3,4-epoxycyclohexyl)propyl groups, etc., and oxiranylalkyl groups such as 4-oxiranylbutyl groups and 8-oxiranyloctyl groups, etc. In particular, glycidoxyalkyl groups such as 3-glycidoxypropyl groups, etc., are especially desirable. If the polysiloxane contains more than one $R'SiO_{3/2}$ units, each $R'$ may be the same or different epoxy groups containing monovalent organic groups. Furthermore, $R^2$ in the above formula indicates substituted or unsubstituted monovalent hydrocarbon groups which may be the same or different. Examples of groups which can be used include alkyl groups such as methyl groups, ethyl groups, propyl groups and butyl groups, etc., alkenyl groups such as vinyl groups, allyl groups, butenyl groups, pentenyl groups and hexenyl groups, etc., aryl groups such as phenyl groups, tolyl groups and xylyl groups, etc., aralkyl groups such as benzyl groups and phenethyl groups, etc., and halogenated alkyl groups such as 3,3,3-trifluoropropyl groups, etc. Furthermore, $R^3$ in the above formula indicates a hydrogen atom or an alkyl group with 4 or fewer carbon atoms. Examples of alkyl groups which can be used as $R^3$ include methyl groups, ethyl groups, propyl groups and butyl groups. Moreover, a, b and d in the above formula are positive numbers, and c is 0 or a positive number.

Examples of methods which can be used to prepare the abovementioned polysiloxane include a method in which an epoxy-group-containing trialkoxysilane expressed by the general formula

(in the above formula, $R^1$ is a monovalent organic group containing an epoxy group, and $R^4$ is an alkyl group with 4 or fewer carbon atoms), a cyclic diorganosiloxane expressed by the general formula

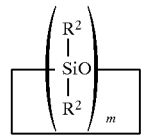

(Formula 3)

(in the above formula, $R^2$ indicates substituted or unsubstituted monovalent hydrocarbon groups which may be the same or different, and m is an integer of 3 or greater), and/or a linear diorganosiloxane expressed by the general formula

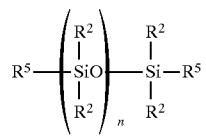

(Formula 4)

(in the above formula, $R^2$ indicates substituted or unsubstituted monovalent hydrocarbon groups which may be the same or different, $R^5$ indicates hydroxy groups, alkoxy groups with 4 or fewer carbon atoms, or substituted or unsubstituted monovalent hydrocarbon groups (which may be the same or different), and n is an integer of 1 or greater), are subjected to equilibrium polymerization in the presence of an acidic or alkaline polymerization catalyst, and a method in which an epoxy-group-containing organopolysiloxane resin expressed by the average unit formula

is subjected to equilibrium polymerization with the abovementioned cyclic diorganosiloxane and/or the abovementioned linear diorganosiloxane in the presence of an acidic or alkaline polymerization catalyst. In particular, preparation by the former method is especially desirable, since such preparation results in good storage stability of the composition of the present invention containing said organopolysiloxane.

In the abovementioned epoxy-group-containing trialkoxysilane, $R^1$ in the above formula is an epoxy-group-containing monovalent organic group; examples of groups which can be used are the same as those described above. Furthermore, $R^4$ in the above formula is an alkyl group with 4 or fewer carbon atoms; examples of such alkyl groups include methyl groups, ethyl groups, propyl groups and butyl groups. Examples of such epoxy-group-containing trialkoxysilanes include 3-glycidoxypropyltrimethoxysilane, 2(3,4-epoxycyclohexyl)ethyltrimethoxysilane, 4-oxiranylbutyltrimethoxysilane and 8-oxiranyloctyltrimethoxysilane. In particular, 3-glycidoxypropyltrimethoxysilane is especially desirable.

Furthermore, in the abovementioned cyclic diorganosiloxane, $R^2$ in the above formula indicates substituted or unsubstituted monovalent hydrocarbon groups which may be the same or different; examples of monovalent hydrocarbon groups which can be used are the same as those described above. Moreover, m in the above formula is an integer of 3 or greater (preferably an integer of 4 or greater, and even more preferably an integer of 4 to 20).

Furthermore, in the abovementioned linear diorganosiloxane, $R^2$ in the above formula indicates substituted or unsubstituted monovalent hydrocarbon groups which may be the same or different; examples of monovalent hydrocarbon groups which can be used are the same as those described above. Moreover, $R^5$ in the above formula indicates hydroxy groups, alkoxy groups with 4 or fewer carbon atoms, or substituted or unsubstituted monovalent hydrocarbon groups (which may be the same or different). Examples of alkoxy groups which can be used as $R^5$ include methoxy groups, ethoxy groups, propoxy groups and butoxy groups. Furthermore, examples of monovalent hydrocarbon groups which can be used as $R^5$ include the same groups as those described for $R^2$ above. Moreover, n in the above formula is an integer of 1 or greater (preferably an integer of 1 to 50).

Examples of methods for effecting the equilibrium polymerization of the abovementioned epoxy-group-containing alkoxysilane, cyclic diorganosiloxane and/or linear diorganosiloxane in the presence of an acidic or alkaline polymerization catalyst include methods in which said epoxy-group-containing alkoxysilane, cyclic diorganosiloxane and/or linear diorganosiloxane are agitated at room temperature or under heating in the presence of an acidic polymerization catalyst, e.g., a mineral acid such as hydrochloric acid, nitric acid or sulfuric acid, etc., a carboxylic acid such as acetic acid or propionic acid, etc., or a solid acid catalyst such as active clay, etc., or in the presence of an alkaline polymerization catalyst, e.g., an alkali metal hydroxide such as sodium hydroxide, potassium hydroxide or cesium hydroxide, etc., an alkaline earth metal hydroxide such as calcium hydroxide or magnesium hydroxide, etc., or an alkali metal salt of siloxane, etc. This equilibrium polymerization reaction is accelerated by heating; in this case, it is desirable that the heating temperature be 50° to 150° C. The equilibrium reaction is stopped by adding a neutralizing agent which neutralizes the polymerization catalyst; in cases where the polymerization catalyst is a solid catalyst, the reaction is generally stopped by removing the catalyst from the reaction system. In cases where an alkaline polymerization catalyst is used, carbonic acid or a chlorosilane compound can be used as the abovementioned neutralizing agent; it is desirable to use a chlorosilane compound such as dimethylchlorosilane or trimethylchlorosilane, etc.

In the composition of the present invention, it is desirable that such a polysiloxane be contained in at least one of the abovementioned compositions, i.e., either the abovementioned curable liquid-form organopolysiloxane composition or the abovementioned curable liquid-form organic resin composition; furthermore, it is especially desirable that such a polysiloxane be contained in the abovementioned organic resin composition. In the composition of the present invention, it is desirable that the content of this polysiloxane be in the range of 0.01 to 80 wt %, and a content of 0.1 to 60 wt % is especially desirable. If the content of the abovementioned polysiloxane is less than 0.01 wt %, the bonding characteristics of the composition of the present invention and the affinity of the curable liquid-form organopolysiloxane composition and curable liquid-form organic resin composition tend to be poor, and it becomes difficult to achieve long-term stabilization of the abovementioned organic resin composition as liquid particles in the abovementioned organopolysiloxane composition, and difficult to reduce the mean particle size of said liquid particles. If the content exceeds 80 wt %, the mechanical strength of the cured product that is obtained tends to drop.

Furthermore, the composition of the present invention may also contain fiber-form fillers such as glass fibers, asbestos, alumina fibers, ceramic fibers consisting of alumina and silica, boron fibers, zirconia fibers, silicon carbide fibers, metal fibers, phenol resin fibers, aramide resin fibers, nylon resin fibers, polyester resin fibers and natural animal or vegetable fibers, etc., inorganic fillers such as fused silica, precipitated silica, fumed silica, calcined silica, zinc oxide, calcined clay, carbon black, glass beads, alumina, talc, calcium carbonate, clay, alumina hydroxide, barium sulfate, titanium dioxide, aluminum nitride, silicon carbide, silicon nitride, magnesium oxide, beryllium oxide, cerium oxide, kaolin, mica and zirconia, etc., metal fillers such as metallic silicon, silver, nickel and copper, etc., and organic fillers such as epoxy resins, phenol resins, nylon resins, polyester resins, fluororesins and silicone resins, etc., as other optional components, as long as such fillers do not interfere with the object of the present invention.

There are no restrictions on the method used to prepare the composition of the present invention; for example, a method can be used in which the abovementioned curable liquid-form organopolysiloxane composition and curable liquid-form organic resin composition, along with other optional components, are mixed by means of an agitating device such as a Henschel, a "HOBART" mixer or a propeller type agitator, etc. "HOBART" is a registered trademark of Hobart Corporation, of Troy, Ohio. Furthermore, the abovementioned curable liquid-form organopolysiloxane composition and curable liquid-form organic resin composition may be mixed after the abovementioned optional organopolysiloxane and inorganic (sic) fillers have been added beforehand to either of said components.

Since the composition of the present invention possesses fluidity prior to being cured, said composition is characterized by superior working characteristics such as handling characteristics, coating characteristics and impregnation characteristics, etc. Accordingly, the composition of the present invention may be used by methods such as transfer molding, injection molding, potting, casting, dip coating, drip coating by means of a dispenser, etc., spray coating and brush coating, etc. As long as the composition of the present invention is liquid, there are no restrictions on the viscosity of the composition at 25° C., and the composition may be used in configurations ranging from a low-viscosity liquid to a high-viscosity paste. Preferably, the composition is used in configurations ranging from a low-viscosity liquid with a viscosity of 100 centipoise (mPa.s.) to a high-viscosity paste with a viscosity of 1,000,000 centipoise (mPa.s.). Furthermore, in the case of the composition of the present invention, the cured product obtained by curing said composition shows superior pliability, initial bonding characteristics and bonding durability in spite of the fact that said cured product has a relatively high hardness. Accordingly, the composition of the present invention is suitable for use as a covering agent or bonding agent (e.g., protective agent, sealing agent or impregnating agent, etc.) for electrical and electronic parts.

Next, the cured product of the present invention will be described in detail.

The cured product of the present invention is characterized by the fact that said product is obtained by curing the abovementioned curable liquid-form composition, and said product contains a cured organic resin as fine particles in a matrix consisting of a cured organopolysiloxane. There are no restrictions on the mean particle size of these fine particles; however, it is desirable that the mean particle size be 1 mm or smaller, and a mean particle size of 0.1 mm or smaller is especially desirable. If the mean particle size of the abovementioned fine particles is larger than 1 mm, the mechanical characteristics of the cured product tend to deteriorate. In regard to the shape of the fine particles, it is desirable that said particles be spherical, and particles which have the shape of a true sphere are especially desirable. Furthermore, there are no restrictions on the content of the abovementioned fine particles in the cured product; however, a content of 0.01 to 80 wt % is desirable, and a content of 10 to 70 wt % is especially desirable. If the fine particle content is less than 0.01 wt %, it becomes difficult to obtain a high hardness in the cured product. If the fine particle content exceeds 80 wt %, the pliability of the cured product tends to deteriorate. The cured product of the present invention is obtained by curing the abovementioned curable liquid-form composition. In cases where this composition is a heat-curable composition, it is desirable that said composition be cured by being heated to a temperature of 50° to 250° C. (preferably 90° to 200° C.).

Next, the electronic part of the present invention will be described in detail.

Figure 2:
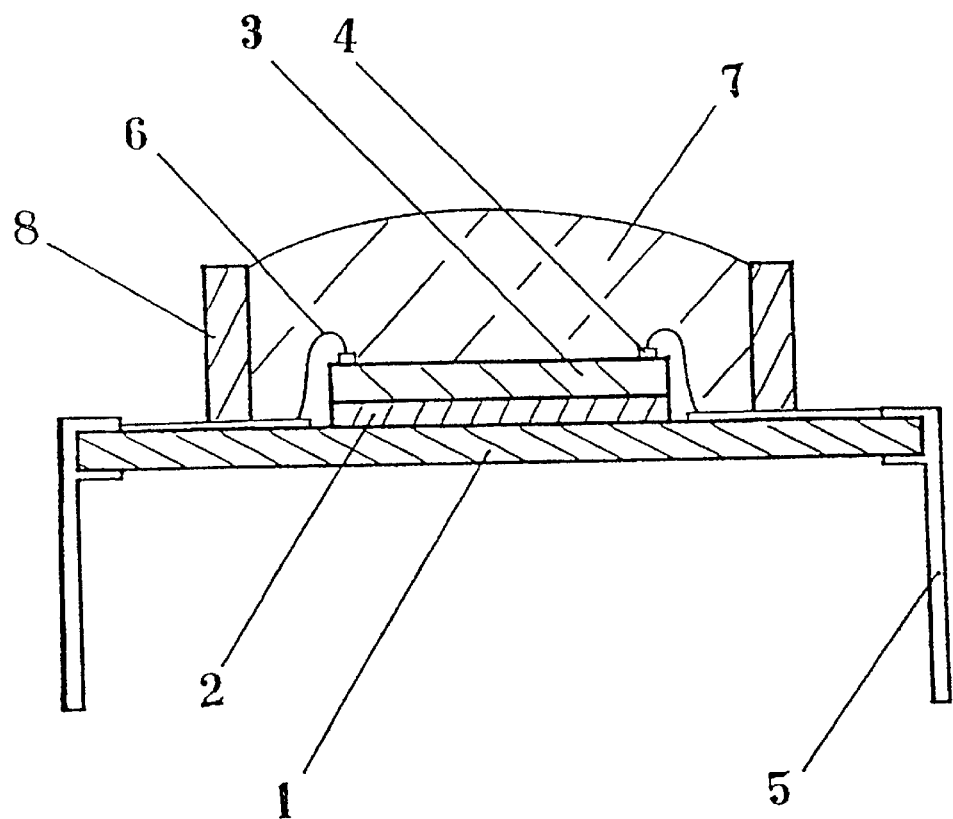
FIG. 2 is a sectional view of an electronic part manufactured in practical examples of application of the present invention.

The electronic part of the present invention is characterized by the fact that said part is sealed by means of the abovementioned cured product. Examples of electronic parts or devices which can be sealed in this way include semiconductor devices such as IC's, hybrid IC's and LSI's, etc., as well as capacitors and electrical resistors. The electronic part of the present invention will be described in detail with reference to the attached figures. For example, as is shown in FIG. 1, the electronic part of the present invention has the following structure: A semiconductor element 3 is mounted on a circuit board 1 via a bonding agent 2, and bonding pads 4 located on the upper portion of this semiconductor element 3 are electrically connected to a lead frame 5 on the circuit board 1 by means of bonding wires 6, said semiconductor element 3 is covered by the cured product 7 of the abovementioned curable liquid-form composition. In cases where this curable liquid-form composition has conspicuous fluidity, a frame 8 may be installed around the periphery of the semiconductor element 3 as shown in FIG. 2, so that the curable liquid-form composition does not flow out around the periphery of the semiconductor element 3 on the circuit board 1 when the semiconductor element 3 is covered by said composition.

There are no particular restrictions on the method used to manufacture the electronic part of the present invention. For example, methods can be used in which the electronic part is covered with the abovementioned curable liquid-form composition, after which said composition is cured by heating (in cases where the composition is a heat-curable composition) or cured by exposure to ultraviolet light (in cases where the composition is a UV-curable composition). In cases where the curable liquid-form composition is cured by heating, there are no restrictions on the temperature to which the composition is heated, as long as said temperature is such that there is no thermal degradation of the electronic part; for example, a temperature of 50° to 250° C. is desirable, and a temperature of 90° to 200° C. is especially desirable.

PRACTICAL EXAMPLES

The curable liquid-form composition, cured product and electronic part of the present invention will be described in detail in terms of practical examples of application. Furthermore, all viscosity values in the practical examples are values measured at 25° C. The mean particle size of the liquid particles consisting of the aforementioned curable liquid-form organic resin composition in the curable liquid-form composition of the present invention, and the mean particle size of the fine particles consisting of the aforementioned cured organic resin in the cured product of the present invention, were measured by means of a microscope. Furthermore, the hardness, pliability, initial bonding characteristics and bonding durability of the cured product of the curable liquid-form composition, and the reliability of the electronic part, were evaluated as described below.

Hardness and Pliability of Cured Product

A cured product was obtained by heating the curable liquid-form composition for 1 hour in a hot air draft circulation type oven at 150° C. The hardness of this cured product was measured by means of a JIS A type hardness tester (hardness: Hs(JIS A)) as stipulated in JIS K 6301, and by means of a type D durometer (hardness: HDD) as stipulated in JIS K 7215. Furthermore, the Young's modulus (kgf/mm$^2$) of the cured product was measured in order to evaluate the pliability of the cured product.

Initial Bonding Characteristics of Cured Product

In each case, the curable liquid-form composition was applied respectively to a quartz glass plate, an aluminum plate and an epoxy resin plate reinforced with glass fibers, and these samples were heated for 1 hour in a hot air draft circulation type oven at 150° C., so that the cured product was formed. The initial bonding characteristics of the cured product samples thus obtained were evaluated using the following grades: circle; strongly bonded, triangle; partial peeling seen, X; complete peeling seen.

Bonding Durability of Cured Product

In each case, the curable liquid-form composition was applied respectively to a quartz glass plate, an aluminum plate and an epoxy resin plate reinforced with glass fibers, and these samples were heated for 1 hour in a hot air draft circulation type oven at 150° C., so that the cured product was formed. Next, these cured product samples were allowed to stand (together with the substrate materials) for 24 hours in an atmosphere with a temperature of 121° C. and a relative humidity of 100%. Afterward, the bonding characteristics of the cured product samples were evaluated using the following grades; circle: strongly bonded, triangle: partial peeling seen, X: complete peeling seen.

Reliability of Electronic Part

The reliability of the electronic part was measured using an electronic part of the type shown in FIG. 2. This electronic part was manufactured as follows: i.e., a semiconductor element 3 with an aluminum wiring pattern formed on its surface was mounted on the surface of a circuit board 1 (made of an alumina ceramic) using a bonding agent 2; afterward, bonding pads 4 located on the upper portion of the semiconductor element 3 were electrically connected to a lead frame 5 by means of metal bonding wires 6. Next, the surface of the semiconductor element 3 was coated with the curable liquid-form composition in question by means of a dispenser. Since the curable liquid-form composition in each case possessed fluidity, a rubber frame 8 with a height of 1 mm was installed around the periphery of the semiconductor element 3 beforehand. Afterward, the curable liquid-form composition was cured by being heated for 1 hour in a hot air draft circulation type oven at 150° C., thus producing an electronic part in which the semiconductor element was covered by the cured product 7. A total of 20 electronic parts were manufactured in this way. Of these 20 electronic parts, 10 parts were subjected to 100 cycles of a thermal cycle test in which one cycle consisting of 30 minutes at minus 30° C. and 30 minutes at plus 100° C., after which the number of electronic parts showing malfunctions was determined. Furthermore, the remaining 10 electronic parts were subjected to 100 repetitions of a pressing test in which a load of 1.0 kgf was applied from directly above the cured product 7, after which the number of electronic parts showing malfunctions was determined.

Reference Example 1

116 g of a cyclic methylvinylsiloxane expressed by the formula

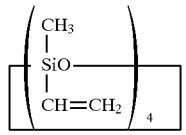

(Formula 5)

100 g of 3-glycidoxypropyltrimethoxysilane and 0.05 g of potassium hydroxide were placed in a four-necked flask equipped with an agitator, a thermometer and a reflux condenser, and this mixture was subjected to an equilibrium polymerization reaction for 3 hours while being heated to 120° C. under agitation. Afterward, this reaction was stopped by means of dimethyldichlorosilane. Low-boiling-point components were then removed by vacuum-distilling the reaction mixture at a temperature of 100° C. and a pressure of 5 mmHg. When the product thus obtained was analyzed by Fourier transform nuclear magnetic resonance analysis, it was found that said product consisted of an organopolysiloxane with the following average unit formula:

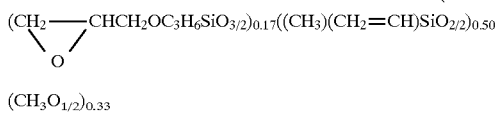

(Formula 6)

$(CH_3O_{1/2})_{0.33}$

Practical Example 1

70.0 parts by weight of a dimethylvinylsiloxy terminated dimethylsiloxane-methylvinylsiloxane copolymer (viscosity: 6,000 centipoise) (which showed some branching), 5.0 parts by weight of a trimethylsiloxy-terminated dimethylsiloxane-methylhydrogensiloxane copolymer (viscosity: 15 centipoise) (an amount which was such that the molar ratio of the hydrogen atoms bonded to silicon atoms in this copolymer to the vinyl groups bonded to silicon atoms in the abovementioned dimethylsiloxane-methylvinylsiloxane copolymer was 1.5), a 1,3-divinyl-1,1,3,3-tetramethyldisiloxane complex of platinum (used in an amount which was such that the concentration of the platinum metal in this complex relative to the heat-curable liquid-form organopolysiloxane composition was 10 ppm (in weight units) and 3-phenyl-1-butyn-3-ol (added as an optional addition reaction inhibitor; used in an amount which was such that the concentration of this agent relative to the heat-curable liquid-form organopolysiloxane composition was 200 ppm (in weight units)) were uniformly mixed, thus producing a heat-curable liquid-form organopolysiloxane composition which was curable by means of a hydroxilylation reaction (the cured product obtained by curing this composition alone was a rubber-form cured product with a JIS A value of 55.

Furthermore, 70.0 parts of an epoxy resin (epoxy equivalents=165) consisting chiefly of a bisphenol F type epoxy resin expressed by the formula

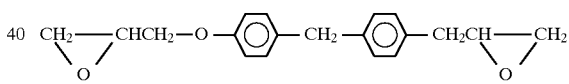

(Formula 7)

(viscosity: 2,000 centipoise (mPa.s.)), 30.0 parts by weight of a silanol-terminated dimethylsiloxane-methylphenylsiloxane copolymer oligomer (viscosity: 500 centipoise (mPa.s.), with the concentration of phenyl groups bonded to silicon atoms in this copolymer oligomer being 44 mol % relative to the total quantity of methyl groups and phenyl groups bonded to silicon atoms in said oligomer) and 0.3 parts by weight of an organo-aluminum chelate compound were uniformly mixed, thus producing a heat-curable liquid-form epoxy resin composition (the cured product obtained by curing this composition alone had a JIS A value of 100.

Next, the total amounts of the abovementioned heat-curable liquid-form organopolysiloxane composition and heat-curable liquid-form epoxy resin composition were uniformly mixed, and 2 parts by weight of fumed silica with a specific surface area of 200 m²/g was added and uniformly mixed as an optional component, thus producing a heat-curable liquid-form composition with a viscosity of 950 poise (95 Pa.s). It was confirmed that in this heat-curable liquid-form composition, the abovementioned heat-curable liquid-form epoxy resin composition was dispersed in the abovementioned heat-curable liquid-form organopolysiloxane composition as liquid particles with a mean particle size of 100 microns.

This heat-curable liquid-form composition was cured by a prescribed method. It was confirmed that in the resulting cured product, a cured epoxy resin was dispersed as fine particles with a mean particle size of 10 microns in a matrix consisting of a cured organopolysiloxane. These fine particles were substantially spherical, but had a wide particle size distribution. The hardness, pliability, initial bonding characteristics and bonding durability of this cured product were evaluated by the methods described above. Furthermore, an electronic part was manufactured using this heat-curable liquid-form composition. The reliability of this electronic part was evaluated by the method described above. The results obtained are shown in Table 1.

Practical Example 2

62.0 parts by weight of a dimethylvinylsiloxy terminated dimethylsiloxane-methylvinylsiloxane copolymer (viscosity: 6,000 centipoise (mPa.s.)) (which showed some branching), 13.0 parts by weight of a trimethylsiloxy-terminated dimethylsiloxane-methylhydrogensiloxane copolymer (viscosity: 15 centipoise (mPa.s.)) (an amount which was such that the molar ratio of the hydrogen atoms bonded to silicon atoms in this copolymer to the vinyl groups bonded to silicon atoms in the abovementioned dimethylsiloxane-methylvinylsiloxane copolymer was 5.0), a 1,3-divinyl-1,1,3,3-tetramethyldisiloxane complex of platinum (used in an amount which was such that the concentration of the platinum metal in this complex relative to the heat-curable liquid-form organopolysiloxane composition was 10 ppm (in weight units)) and 3-phenyl-1-butyn-3-ol (added as an optional addition reaction inhibitor, used in an amount which was such that the concentration of this agent relative to the heat-curable liquid-form organopolysiloxane composition was 200 ppm (in weight units)) were uniformly mixed, thus producing a heat-curable liquid-form organopolysiloxane composition which was curable by means of a hydrosilylation reaction (the cured product obtained by curing this composition alone was a rubber-form cured product with a JIS A value of 55.

Furthermore, 70.0 parts of an epoxy resin (epoxy equivalents=165) consisting chiefly of a bisphenol F type epoxy resin expressed by the formula (Formula 8)

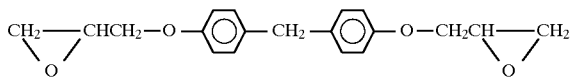

(viscosity: 2,000 centipoise (mPa.s.)), 10.0 parts by weight of the organopolysiloxane prepared in Reference Example 1, 20.0 parts by weight of a silanol-terminated dimethylsiloxane-methylphenylsiloxane copolymer oligomer (viscosity: 500 centipoise (mPs.s.), with the concentration of phenyl groups bonded to silicon atoms in this copolymer oligomer being 44 mol % relative to the total quantity of methyl groups and phenyl groups bonded to silicon atoms in said oligomer) and 0.3 parts by weight of an organo-aluminum chelate compound were uniformly mixed, thus producing a heat-curable liquid-form epoxy resin composition (the cured product obtained by curing this composition alone had a JIS A value of 100.

Next, the total amounts of the abovementioned heat-curable liquid-form organopolysiloxane composition and heat-curable liquid-form epoxy resin composition were uniformly mixed, and 2 parts by weight of fumed silica with a specific surface area of 200 m²/g was added and uniformly mixed as an optional component, thus producing a heat-curable liquid-form composition with a viscosity of 540 poise (54 Pa.s). It was confirmed that in this heat-curable liquid-form composition, the abovementioned heat-curable liquid-form epoxy resin composition was dispersed in the abovementioned heat-curable liquid-form organopolysiloxane composition as liquid particles with a mean particle size of 10 microns.

This heat-curable liquid-form composition was cured by a prescribed method. It was confirmed that in the resulting cured product, a cured epoxy resin was dispersed as fine particles with a mean particle size of 10 microns in a matrix consisting a cured organopolysiloxane. These fine particles had a true spherical shape, and showed a narrow particle size distribution. The hardness, pliability, initial bonding characteristics and bonding durability of this cured product were evaluated by the methods described above. Furthermore, an electronic part was manufactured using this heat-curable liquid-form composition. The reliability of this electronic part was evaluated by the method described above. The results obtained are shown in Table 1.

Practical Example 3

82.0 parts by weight of a dimethylvinylsiloxy-terminated dimethylsiloxane-methylphenylsiloxane copolymer (viscosity: 1,500 centipoise (mPa.s.)), 5.0 parts by weight of a trimethylsiloxy-terminated dimethylsiloxane-methylhydrogensiloxane copolymer (viscosity: 15 centipoise (mPa.s.)) (an amount which was such that the molar ratio of the hydrogen atoms bonded to silicon atoms in this copolymer to the vinyl groups bonded to silicon atoms in the abovementioned copolymer was 4.0), a 1,3-divinyl-1,1,3,3-tetramethyldisiloxane complex of platinum (used in an amount which was such that the concentration of the platinum metal in this complex relative to the heat-curable liquid-form organopolysiloxane composition was 10 ppm (in weight units)) and 3-phenyl-1-butyn-3-ol (added as an optional addition reaction inhibitor; used in an amount which was such that the concentration of this agent relative to the heat-curable liquid-form organopolysiloxane composition was 200 ppm (in weight units)) were uniformly mixed, thus producing a heat-curable liquid-form organopolysiloxane composition which was curable by means of a hydroxilylation reaction (the cured product obtained by curing this composition alone was a rubber-form cured product with a JIS A value of 30.

Furthermore, 75.0 parts of an epoxy resin (epoxy equivalents=165) consisting chiefly of a bisphenol F type epoxy resin expressed by the formula (Formula 9)

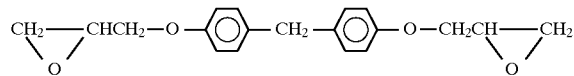

(viscosity: 2,000 centipoise (mPa.s.)), 5.0 parts by weight of the organopolysiloxane prepared in Reference Example 1, 20.0 parts by weight of a silanol-terminated dimethylsiloxane-methylphenylsiloxane copolymer oligomer (viscosity: 500 centipoise (mPa.s.), with the concentration of phenyl groups bonded to silicon atoms in this copolymer oligomer being 44 mol % relative to the total quantity of methyl groups and phenyl groups bonded to silicon atoms in said oligomer) and 0.3 parts by weight of an organo-aluminum chelate compound were uniformly mixed, thus producing a heat-curable liquid-form epoxy resin composition (the cured product obtained by curing this composition alone had a JIS A value of 100.

Next, the abovementioned heat-curable liquid-form organopolysiloxane composition and heat-curable liquid-form epoxy resin composition were uniformly mixed, and 2 parts by weight of fumed silica with a specific surface area of 200 m²/g was added and uniformly mixed as an optional component, thus producing a heat-curable liquid-form composition with a viscosity of 320 poise (Pa.s.). It was confirmed that in this heat-curable liquid-form composition, the abovementioned heat-curable liquid-form epoxy resin composition was dispersed in the abovementioned heat-curable liquid-form organopolysiloxane composition as liquid particles with a mean particle size of 10 microns.

This heat-curable liquid-form composition was cured by a prescribed method. It was confirmed that in the resulting cured product, a cured epoxy resin was dispersed as fine particles with a mean particle size of 10 microns in a matrix consisting of a cured organopolysiloxane. These fine particles had a true spherical shape, and showed a narrow particle size distribution. The hardness, pliability, initial bonding characteristics and bonding durability of this cured product were evaluated by the methods described above. Furthermore, an electronic part was manufactured using this heat-curable liquid-form composition. The reliability of this electronic part was evaluated by the method described above. The results obtained are shown in Table 1.

Comparative Example 1

2 parts by weight of fumed silica with a specific surface area of 200 m²/g was uniformly mixed with the heat-curable liquid-form organopolysiloxane composition prepared in Practical Example 1, thus producing a heat-curable liquid-form organopolysiloxane composition with a viscosity of 120 poise (12 Pa.s).

This heat-curable organopolysiloxane composition was cured by a prescribed method. The hardness, pliability, initial bonding characteristics and bonding durability of this cured product were evaluated by the methods described above. Furthermore, an electronic part was manufactured using this heat-curable liquid-form organopolysiloxane composition. The reliability of this electronic part was evaluated by the method described above. The results obtained are shown in Table 1.

Comparative Example 2

2 parts by weight of fumed silica with a specific surface area of 200 m²/g was uniformly mixed with the heat-curable liquid-form epoxy resin composition prepared in Practical Example 1, thus producing a heat-curable liquid-form epoxy resin composition with a viscosity of 70 poise (7 Pa.s).

This heat-curable epoxy resin composition was cured by a prescribed method. The hardness, pliability, initial bonding characteristics and bonding durability of this cured product were evaluated by the methods described above. Furthermore, an electronic part was manufactured using this heat-curable liquid-form epoxy resin composition. The reliability of this electronic part was evaluated by the method described above. The results obtained are shown in Table 1.

Comparative Example 3

The heat-curable liquid-form organopolysiloxane composition and heat-curable liquid-form epoxy resin composition in Practical Example 1 were uniformly mixed at a weight ratio of 1:10, and 2 parts by weight of fumed silica with a specific surface area of 200 m²/g was added and uniformly mixed as an optional component, thus producing a curable liquid-form composition with a viscosity of 90 poise (9 Pa.s). It was confirmed that in this heat-curable liquid-form composition, the abovementioned heat-curable liquid-form organopolysiloxane composition was dispersed in the abovementioned heat-curable liquid-form epoxy resin composition as liquid particles with a mean particle size of 100 microns.

This heat-curable liquid-form composition was cured by a prescribed method. It was confirmed that in the resulting cured product, a cured organopolysiloxane was dispersed as fine particles with a mean particle size of 100 microns in a matrix consisting of a cured epoxy resin. The hardness, pliability, initial bonding characteristics and bonding durability of this cured product were evaluated by the methods described above. Furthermore, an electronic part was manufactured using this heat-curable liquid-form composition. The reliability of this electronic part was evaluated by the method described above. The results obtained are shown in Table 1.

Comparative Example 4

A curable liquid-form organopolysiloxane composition was prepared in the same manners as in Practical Example 1, except that 95 parts by weight of an epoxy resin (epoxy equivalents=165) consisting chiefly of a bisphenol F type epoxy resin expressed by the formula (Formula 10)

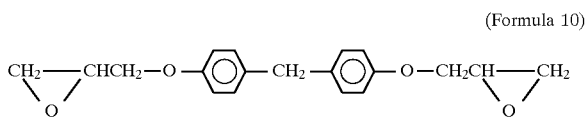

(viscosity: 2,000 centipoise (mPa.s.)) was used instead of the heat-curable liquid-form epoxy resin composition used in Practical Example 1. It was confirmed that in this heat-curable liquid-form organopolysiloxane composition, the abovementioned liquid-form epoxy resin was dispersed as liquid particles with a mean particle size of 100 microns.

This heat-curable liquid-form organopolysiloxane composition was cured by la prescribed method. It was confirmed that in this cured product, a liquid-form epoxy resin was dispersed as liquid particles with a mean particle size of 100 microns in a matrix consisting of a cured organopolysiloxane. The hardness, pliability, initial bonding characteristics and bonding durability of this cured product were evaluated by the methods described above. Furthermore, an electronic part was manufactured using this heat-curable liquid-form composition. The reliability of this electronic part was evaluated by the method described above. The results obtained are shown in Table 1.

Comparative Example 5

Instead of using the heat-curable liquid-form epoxy resin composition used in Practical Example 1, an attempt was made to add 100 parts by weight of a powdered cured epoxy resin with a mean particle size of 10 microns prepared by finely pulverizing a cured epoxy resin obtained by heating the abovementioned heat-curable liquid-form epoxy resin composition for 1 hour in a hot air draft circulation type oven at 150° C.; however, complete mixing of this powder proved to be impossible, so that a lumpy mixture was obtained.

TABLE 1

|  | Present Invention | | | Comparative Examples | | | Comp. |
| --- | --- | --- | --- | --- | --- | --- | --- |
|  | Pr. Ex. 1 | Pr. Ex. 2 | Pr. Ex. 3 | Comp. Ex. 1 | Comp. Ex. 2 | Comp. Ex. 3 | Ex. 4 |
| Cured product | | | | | | | |
| Hardness (JIS A) durometer | 95 | 92 | 80 | 55 | 100 | 100 | 38 |
| D durometer | 42 | 37 | 23 | — | 85 | 80 | — |
| Pliability (kgf/mm$^2$) | 2.0 | 1.8 | 1.0 | 0.3 | 280 | 150 | 0.1 |
| Initial bonding characteristics | | | | | | | |
| Quartz glass plate | ○ | ○ | ○ | Δ | ○ | ○ | Δ |
| Aluminum plate | ○ | ○ | ○ | Δ | ○ | ○ | Δ |
| Epoxy resin plate | ○ | ○ | ○ | ○ | ○ | ○ | Δ |
| Bonding durability | | | | | | | |
| Quartz glass plate | Δ | ○ | ○ | x | Δ | Δ | x |
| Aluminum plate | ○ | ○ | ○ | x | Δ | Δ | x |
| Epoxy resin plate | ○ | ○ | ○ | Δ | ○ | ○ | x |
| Reliability of electronic part | | | | | | | |
| Thermal cycle test | 0 | 0 | 0 | 0 | 3 | 2 | 1 |
| Pressing test | 0 | 0 | 0 | 7 | 0 | 0 | 10 |

Prior to being cured, the curable liquid-form composition of the present invention is liquid, and has superior working characteristics. Furthermore, when cured, the curable liquid-form composition of the present invention forms a cured product which has superior pliability, initial bonding characteristics and bonding durability, in spite of the fact that the hardness of said cured product is relatively high. Furthermore, the cured product of the present invention is obtained by curing the abovementioned composition, and is characterized by the fact that said cured product has superior pliability in spite of having a relatively high hardness. Moreover, the electronic part of the present invention is covered by the cured product of the abovementioned composition, and is characterized by the fact that said part has superior reliability (moisture resistance, etc.).

That which is claimed is:

1. A curable liquid-form composition, comprising:
   A) a curable, non-crosslinked liquid-form organopolysiloxane composition; and
   B) a curable liquid-form organic resin composition;
   wherein said curable liquid-form organic resin composition is contained in said curable liquid-form organopolysiloxane composition as liquid particles and wherein said curable liquid-form organopolysiloxane composition is curable via a hydroxilylation reaction.

2. The curable liquid-form composition claimed in claim 1, wherein the curable liquid-form organic resin composition comprises 0.01 to 80 wt % of said curable liquid-form composition.

3. The curable liquid-form composition claimed in claim 1, wherein the mean particle size of the liquid particles is less than or equal to 1 mm.

4. The curable liquid-form composition claimed in claim 1, wherein the heat-curable liquid-form organic resin composition comprises (i) 100 parts by weight of a liquid-form epoxy resin having at least two epoxy groups per molecule, (ii) 0.1 to 200 parts by weight of a silanol-terminated diorganosiloxane oligomer; and (iii) a curing catalyst, in an amount sufficient to cure the heat-curable liquid-form epoxy resin composition.

5. The curable liquid-form composition claimed in claim 4, wherein at least 10 mol % of the silicon-bonded organic groups in component (ii) are phenyl groups.

6. The curable liquid-form composition claimed in claim 1, wherein at least one of the curable liquid-form organopolysiloxane composition and the curable liquid-form organic resin composition contain a polysiloxane having the average unit formula:

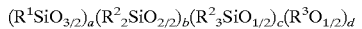

wherein $R^1$ is an epoxy group-containing monovalent organic group; $R^2$ is individually selected from monovalent hydrocarbon groups; $R^3$ is a hydrogen atom or an alkyl group having 4 or fewer carbon atoms; a, b and d are respective positive numbers; and c is 0 or a positive number.

7. The curable liquid-form composition claimed in claim 6, wherein the polysiloxane is prepared by subjecting I) an epoxy-group-containing trialkoxysilane having the general formula

wherein $R^1$ is an epoxy-group containing a monovalent organic group, and $R^4$ is an alkyl group having 4 or fewer carbon atoms, and II) a compound selected from the group consisting of
   a) diorganosiloxanes having the general formula:

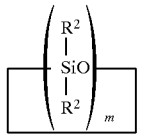

(I)

wherein each $R^2$ is individually selected from the group consisting of substituted or unsubstituted monovalent hydrocarbon groups; and m is an integer having a value of at least 3; and b) linear diorganosiloxanes having the general formula:

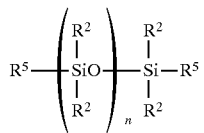

wherein each $R^2$ is individually selected from the group consisting of substituted or unsubstituted monovalent hydrocarbon groups; each $R^5$ is individually selected from the group consisting of a hydroxy group, alkoxy groups with 4 or fewer carbon atoms, and substituted or unsubstituted monovalent hydrocarbon groups, and n is an integer having a value of at least 1; to equilibrium polymerization in the presence of a polymerization catalyst selected from the group consisting of acidic and alkaline polymerization catalysts.

8. A cured product comprising (i) fine particles of a cured organic resin; and (ii) a cured organopolysiloxane;

wherein said fine particles of said cured organic resin are contained in a matrix of said cured organopolysiloxane and wherein said cured organopolysiloxane is prepared by curing the curable liquid-form composition of claim 1.

9. An electronic part comprising:

1) an electronic device; and 2) the cured product of claim 8;

wherein said electronic device is sealed with said cured product.

* * * * *